(12) United States Patent
Krishnan et al.

(10) Patent No.: US 7,741,866 B2
(45) Date of Patent: Jun. 22, 2010

(54) LOAD-AWARE CIRCUIT ARRANGEMENT

(75) Inventors: Rohini Krishnan, Eindhoven (NL); Rinze Ida Mechtildis Peter Meijer, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/583,808

(22) PCT Filed: Dec. 8, 2004

(86) PCT No.: PCT/IB2004/052710

§ 371 (c)(1),
(2), (4) Date: Jun. 22, 2006

(87) PCT Pub. No.: WO2005/064796

PCT Pub. Date: Jul. 14, 2005

(65) Prior Publication Data

US 2007/0115026 A1    May 24, 2007

(30) Foreign Application Priority Data

Dec. 23, 2003   (EP) .................................. 03104934

(51) Int. Cl.
 *H03K 17/16* (2006.01)
 *H03K 19/003* (2006.01)
(52) U.S. Cl. .......................................... 326/30; 326/83
(58) Field of Classification Search ...................... None
   See application file for complete search history.

(56) References Cited

U.S. PATENT DOCUMENTS

| | | | |
|---|---|---|---|
| 5,134,311 A * | 7/1992 | Biber et al. ................. | 327/108 |
| 5,220,216 A * | 6/1993 | Woo ............................ | 326/50 |
| 5,220,516 A * | 6/1993 | Dodson et al. .............. | 709/217 |
| 5,666,078 A | 9/1997 | Lamphier et al. | |
| 5,801,548 A * | 9/1998 | Lee et al. ...................... | 326/44 |
| 5,994,922 A | 11/1999 | Aoki et al. | |
| 6,075,379 A | 6/2000 | Haider et al. | |
| 6,087,847 A | 7/2000 | Mooney et al. | |
| 6,331,785 B1 | 12/2001 | Swanson et al. | |
| 6,445,245 B1 * | 9/2002 | Schultz et al. .............. | 327/541 |
| 6,466,487 B1 * | 10/2002 | Otsuka .................. | 365/189.05 |
| 6,545,522 B2 * | 4/2003 | Mughal et al. .............. | 327/334 |
| 6,642,740 B2 * | 11/2003 | Kim et al. ...................... | 326/30 |
| 6,836,143 B2 * | 12/2004 | Song ........................... | 326/30 |
| 7,035,148 B2 * | 4/2006 | Chung et al. ........... | 365/189.05 |
| 7,053,148 B2 * | 5/2006 | Dirschl et al. ............... | 524/588 |
| 2002/0113628 A1 * | 8/2002 | Ajit ............................ | 327/108 |

\* cited by examiner

*Primary Examiner*—Rexford N Barnie
*Assistant Examiner*—Dylan White

(57) ABSTRACT

The present invention relates to a circuit arrangement and method of controlling power consumption of the circuit arrangement, wherein a load applied at a circuit component is determined and the drive capacity of the circuit component is adjusted responsive to the determination result. In particular, the circuit component is tailored to have just sufficient drive capacity depending on the potential load which may be determined by examining a configuration information loaded to the circuit arrangement. Tailoring for sufficient drive can be achieved either by varying the size or number of circuit components or by adjusting the threshold voltage of circuit elements, or by doing both. Thereby, power consumption can be reduced when circuit components are driven at loads lower than the worst case load.

15 Claims, 10 Drawing Sheets

LOAD-AWARE CIRCUIT ARRANGEMENT

The present invention relates a circuit arrangement comprising at least one circuit component at which a load is applied that can vary during operation of the circuit arrangement. Furthermore, the present invention relates to a method of controlling power consumption of such a circuit arrangement, such as for example a field programmable gate array (FPGA).

Unlike application specific integrated circuits (ASICs), FPGAs can perform different functions depending on a configuration bit stream which is loaded. The circuit components inside the FPGA, like buffers, logic gates, connection boxes, switch boxes etc., have different input load (fan-in) and output load (fan-out) depending on the configuration which is determined by the configuration bit stream loaded into the FPGA. Conventional methods in FPGA circuit design have always designed the components for the worst-case load. This is reasonable in ASIC design where the exact load can be determined from the layout after place and route phase.

In contrast thereto, for FPGAs, this approach may result in over-designed components due to the fact that the actual load being driven by or supplied to the components for a particular configuration can be much less than the worst-case load.

Document US 2002/0141234 discloses a structure for reducing leakage current in submicron IC devices wherein extra configuration memory cells are used to control a series transistor connected between power supply and ground. This series transistor is turned off in stand-by modus to reduce leakage current. The extra configuration information is thus used to reduce stand-by power dissipation but not to reduce active power consumption. Hence, this method still suffers from the overhead of large capacitances associated with over-designed components designed to drive the worst-case load.

It is therefore an object of the present invention to provide a circuit arrangement and method of controlling power consumption by means of which over-design of components can be at least reduced.

This object is achieved by a circuit arrangement as claimed in claim 1 and by a method as claimed in claim 11.

Accordingly, the problem of over-design is solved by tailoring the components to have just sufficient drive capacity depending on the potential load, which is determined by examining the actual load applied at the at least one circuit component. Thereby, component design can be adapted for lowest power-delay-product in different load situations ranging from very low to worst-case loading. This solution can also be applied in the stand-by mode of operation of components to reduce stand-by leakage.

The determination means may be configured to determine the load based on a configuration information loaded to the circuit arrangement. In particular, this configuration information may be stored in a configuration memory. As an example, the configuration information may comprise a configuration bit stream defining at least one of an input load and an output load of the at least one component. Thereby, a configuration information as used for example in FPGAs or other configurable circuit arrangements can be used to adjust the drive capacity of the individual components to thereby optimize the power consumption by tailoring the components so as to provide sufficient drive capacity for the selected configuration.

In particular, the adjusting means may be configured to vary a buffer size or a buffer number of the at least one component. This may be achieved by switching on or off individual buffers or buffer sections responsive to the determination means. As an example, at least one control signal may be generated by the adjusting means for switching on or off the buffers or buffer sections. Thus, a programmable configuration can be obtained, which can be adapted depending on the load or configuration to gain speed and/or safe energy when smaller loads are applied to the components. Specifically, the control signal may be derived from a most significant bit signal of a selection signal derived from the determination means. In this case, selection signals supplied from the configuration memory e.g. of an FPGA can be directly used to switch track buffers into stand-by mode. This leads to a considerable reduction in the active energy consumption. This reduction is obtained at a small area overhead for the buffer.

According to another aspect of the present invention, the adjusting means may be configured to vary a threshold voltage of circuit elements of the circuit arrangement. This may be achieved by changing at least one bias voltage responsive to the determination means. By applying the bias voltage, buffers can be kept smaller in size and can thus have lower power-delay-product and faster speed. Hence, based on the actual configuration, buffers can be optimized for lowest power-delay-product at the same or higher speed.

Further advantageous developments are defined in the dependent claims.

The invention will now be described in greater detail based on preferred embodiments with reference to the accompanying drawings, in which.

Figure 1:
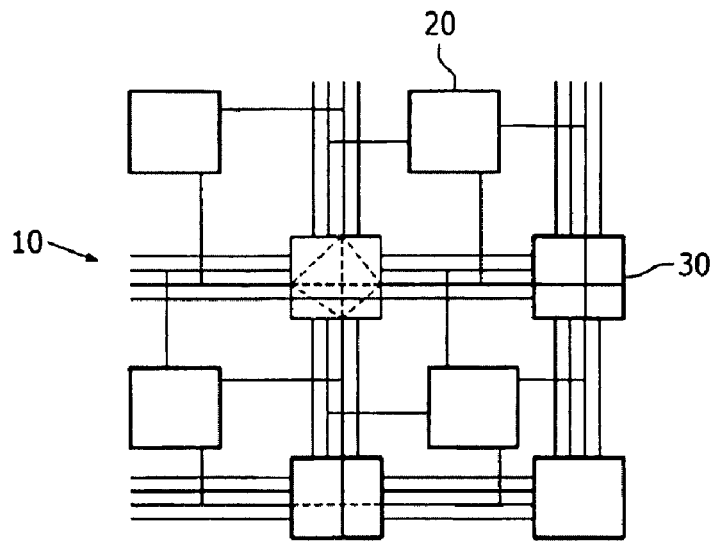
FIG. 1 shows a schematic diagram indicating the structure of an FPGA in which the present invention can be implemented.

The preferred embodiments will now be described on the basis of an exemplary FPGA circuit arrangement as shown in FIG. 1.

According to FIG. 1, the FPGA circuit arrangement comprises logic blocks 20, input/output blocks (not shown) and programmable routing. In the present case, a so-called island-style FPGA is shown, where the logic blocks 20 are surrounded by pre-fabricated wiring segments 10 on all four sides. Input or output terminals of the logic blocks 20 can be connected to wiring segments 10 comprising a plurality of routing wires in the channel adjacent to the logic blocks 20 via a connection block of programmable switches. At every intersection of a horizontal and a vertical channel, a switch box 30 is provided. Thereby, the FPGA interconnect can be configured by programming the switch boxes 30 to achieve a predetermined circuit configuration.

Figure 2A:
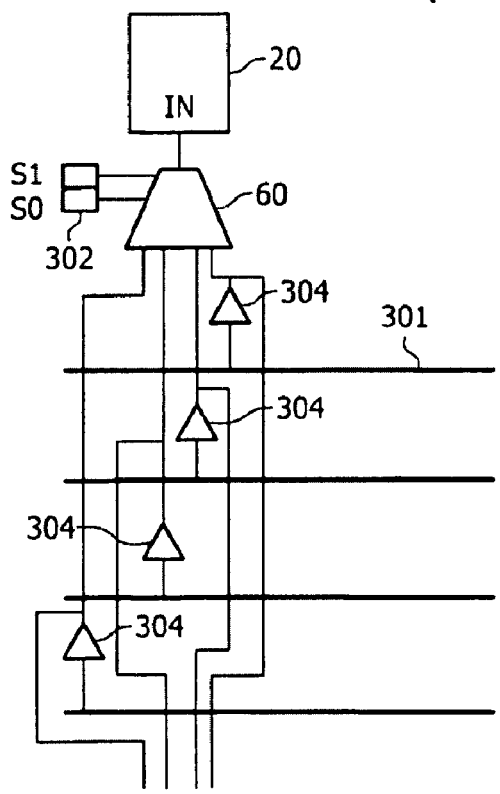
FIG. 2A shows a conventional connection box as used in FPGAs.

FIG. 2A shows a connection box used to connect the logic block 20 to the wiring segments 10 of FIG. 1. According to FIG. 2A, routing wires 301 of a wiring segment 10 are connected via track buffers 304 and a multiplexing circuit 60 controlled by selection signals S0 and S1, which are derived from a configuration information loaded to the FPGA and which may be stored in respective memory cells, e.g. Static Random Access Memory (SRAM) cells 302, to an input port of the logical block 20. Based on the combination of logical levels of the binary selection signals S0 and S1, one of the outputs of the track buffers 304 is connected to the input port of the logic block 20.

Figure 2B:
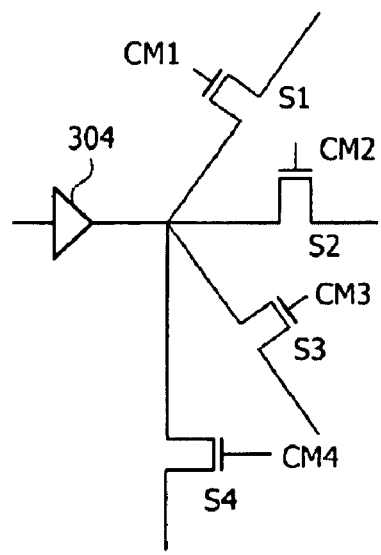
FIG. 2B shows a buffer driving fan-out path as used in FPGAs.

FIG. 2B shows a schematic diagram of an internal portion of one of the switch boxes 30 of FIG. 1 or any other fan-out node in the FPGA. A buffer 304 is used to drive programmable switches S1 to S4 which are controlled by respective selection signals CM1 to CM4 which are derived from the configuration information loaded to the FPGA.

Such buffers 304 of connection boxes as shown in FIG. 1 and fan-out paths and/or switch boxes 30 as shown in FIG. 2 are provided on FPGAs in large numbers. It is therefore desirable to reduce the amount of energy consumed in these components to achieve a reduction in the overall energy consumed by the FPGA. Reducing the amount of energy is especially critical in FPGAs, since a three order of magnitude difference exists between the energy consumption of FPGAs and ASICs.

It is therefore suggested to tailor the components of the FPGA so as to have just sufficient drive capacity depending on the potential load, which may determined by examining the configuration information.

According to the first and second preferred embodiments, tailoring for sufficient drive capacity can be achieved by varying the size and/or number of the buffers 304. In particular, the drive capacity or drive strength is varied based on the potential load which is applied to a component or which a component has to drive.

Figure 3:
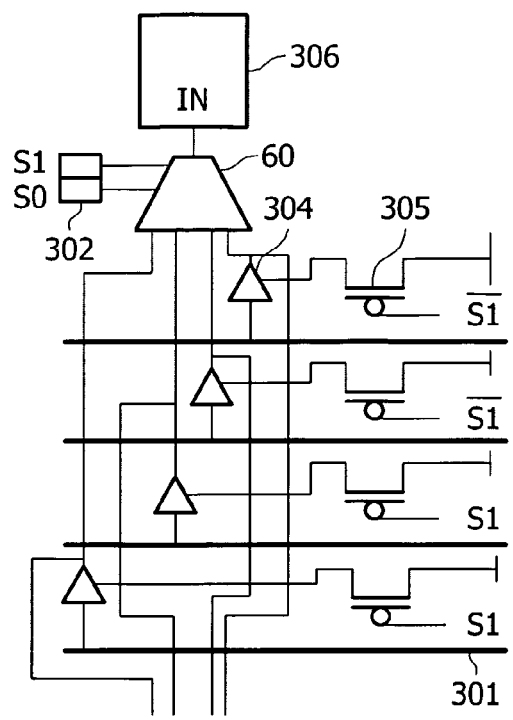
FIG. 3 shows a configuration aware connection box according to a first preferred embodiment.

FIG. 3 shows a proposed modification of the connection box 30 of FIG. 2A according to the first preferred embodiment, wherein the selection signals S0 and S1 which are supplied from a configuration memory are directly used for controlling the track buffers 304, e.g. for setting them into a stand-by mode. This can be achieved by providing controllable switching elements, e.g. transistor elements, for disconnecting the track buffers 304 from a power supply terminal.

In the present example shown in FIG. 3, only the most significant bit signal S1 of the selection signals is used to control the switching elements 305, wherein the upper two switching elements of FIG. 3 are switched to an opposite state of the lower two switching elements by inverting the MSB selection signal S1. Thereby, depending on the selection of the multiplexing circuit, either the left two or the right two track buffers 304 are put into the stand-by state. When the MSB selection signal S1 of the multiplexer is high, the two most significant track buffers 304 are on and when the selection signal S1 is low, the two least significant track buffers are on. By putting non-used track buffers into the stand-by state, a reduction in the active energy consumption can be achieved. Furthermore, using only the MSB selection signal S1 to put track buffers into the stand-by state provides the advantage of less energy consumption at absolutely no area overhead. However, in this case, not all non-used track buffers are turned off, but only half of the total number of buffers. If all non-used track buffers are to be turned off, a dedicated decoding circuit can be provided for decoding the selection signals S0 and S1 to provide control signals for the switching elements 305 in a manner that only the used track buffer, i.e. the track buffer of the signal line which is switched through the multiplexer, is kept in an active state.

The use of the MSB selection without the decoding circuit already leads to a 11.2 percent reduction in active energy for a connection box in a 0.13 um CMOS technology with a 4:1 multiplexer at no area overhead. For larger multiplexers even larger reductions can be achieved. The use of the selection signals of the multiplexer themselves as control signals for disconnecting the track buffers 304 from the power supply provides the additional advantage that noise due to floating nodes is prevented when some of the buffers 304 in the connection boxes 30 are turned off.

Figure 4:
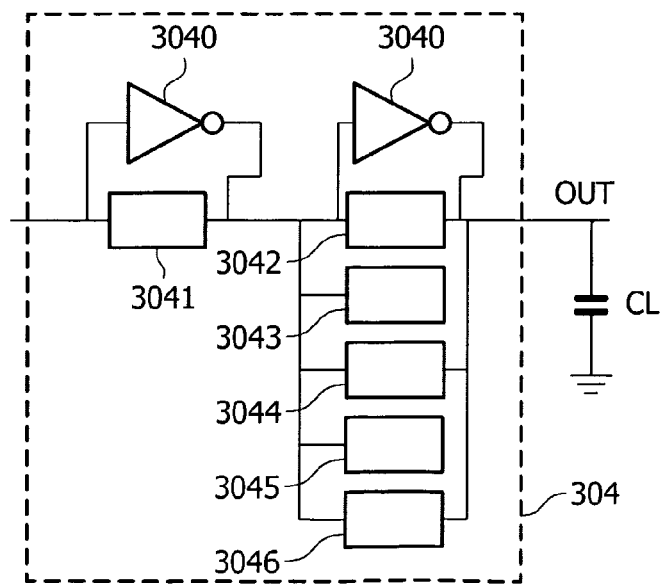
FIG. 4 shows a configuration aware buffer circuit according to a second preferred embodiment.

FIG. 4 shows a programmable structure of the buffers 304 according to the second preferred embodiment. The programmable buffer 304 consists of two small inverters 3040 which are always in an active state. The other buffer stages or buffer sections 3041 to 3046 are programmable or controllable to be switched on or off. In particular, the programmable buffer 304 is configured in such a way, that its delay corresponds to the conventional buffers when all its buffer stages 3041 to 3046 are turned on. This configuration is used for worst-case loading. By turning on or off some of the buffer stages 3041 to 3046 of the programmable buffer 304, depending on the actual load, a significant speed-up and saving of energy can be achieved when the buffer is driving much smaller loads than the worst-case load. The capacitor CL in FIG. 4 represents the capacitive load to be driven by the programmable buffer 304.

Figure 5:
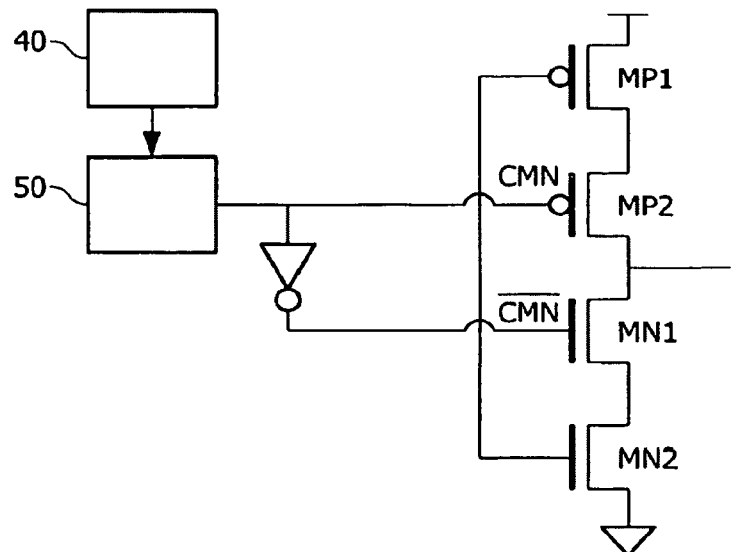
FIG. 5 shows a more detailed view of a programmable buffer section as used in the second preferred embodiment.

FIG. 5 shows a more detailed view of the buffer stages 3041 to 3046 of FIG. 4, wherein a control signal CMN which is used to turn on or off the programmable buffer stages 3041 to 3046 is generated at a decoding or control circuit 50 based on a configuration information supplied from the configuration memory 40 of the FPGA. When the control signal CMN is at a low level the respective programmable buffer stage is turned on, and when the control signal CMN is at a high level, the respective programmable buffer stage is turned off. In FIG. 5, this behaviour is achieved by a CMOS buffer circuit comprising a series connection of two p-channel transistors MP1 and MP2 and two n-channel transistors MN1 and MN2, wherein the control signal CMN is supplied to one of the transistors and an inverted version of the control signal CMN is supplied to another one of the transistors of opposite channel polarity. Thereby, these two controlled transistors can be switched on or off by the selection signal CMN to respectively activate or deactivate the buffer stage.

To determine the range of capacitive loads for which control signals need to be activated or deactivated, simulations may be performed. Possible results of such simulations are shown in the following FIGS. 6 to 9. In these graphs, the legend "CONV" refers to the conventional buffer, and the legend "PRGuvwxyz" refers to the programmable buffer 307, wherein the binary values of the variables "u" to "z" indicate the switching state of the buffer stages 3041 to 3046 of FIG. 4. Hence, "PRG111111" refers to a programmable buffer with all stages turned on, while "PRG110000" refers to the programmable buffer with stages 3041 and 3042 turned on and the remaining stages 3043 to 3046 turned off.

Figure 6:
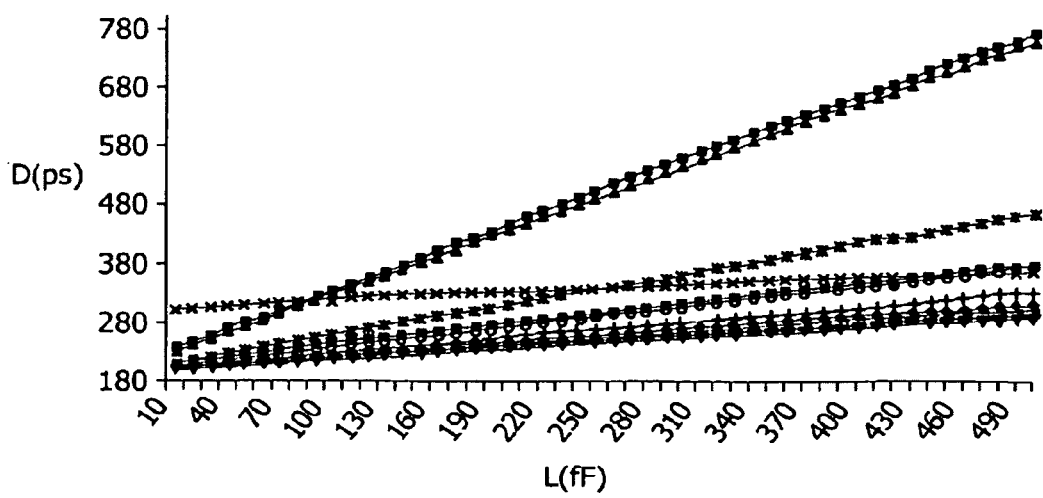
FIGS. 6 and 7 show diagrams of delay vs capacitive load for a conventional and a programmable buffer according to the second preferred embodiment for different load ranges.
Figure 7:
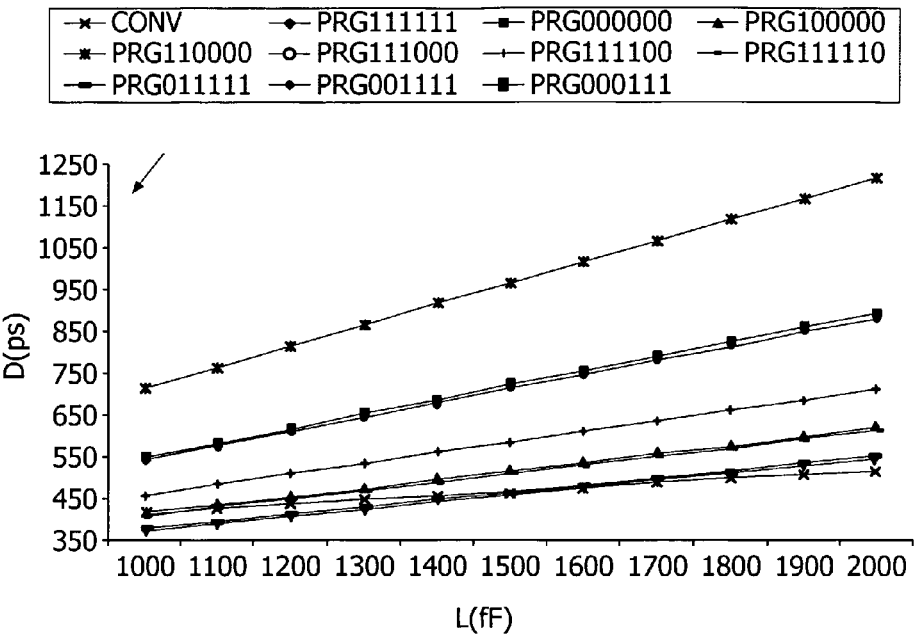
Figure 8:
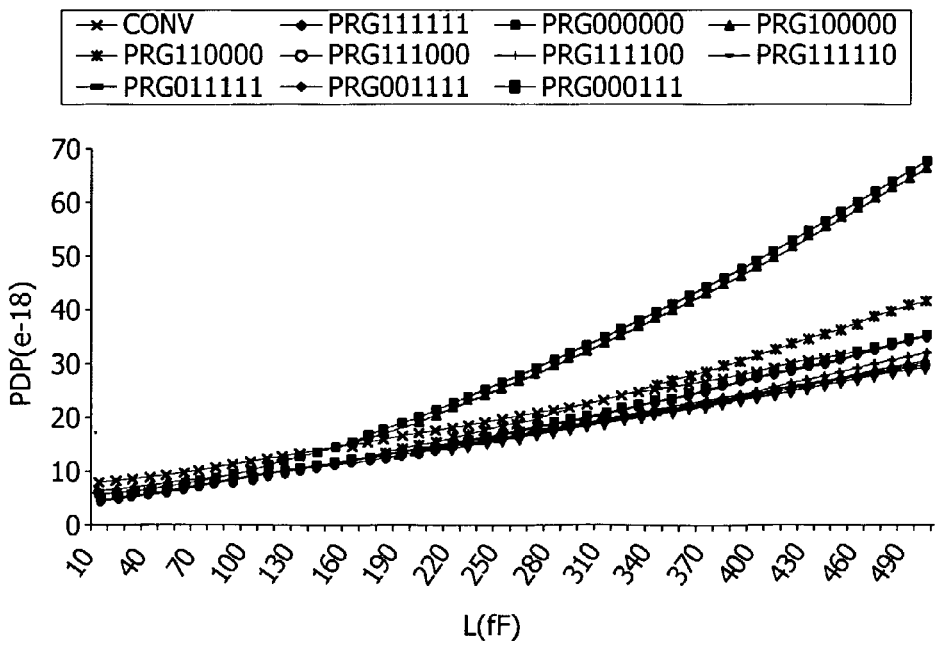
FIGS. 8 and 9 show diagrams of power-delay-product vs capacitive load for a conventional and a programmable buffer according to the second preferred embodiment for different load ranges.
Figure 9:
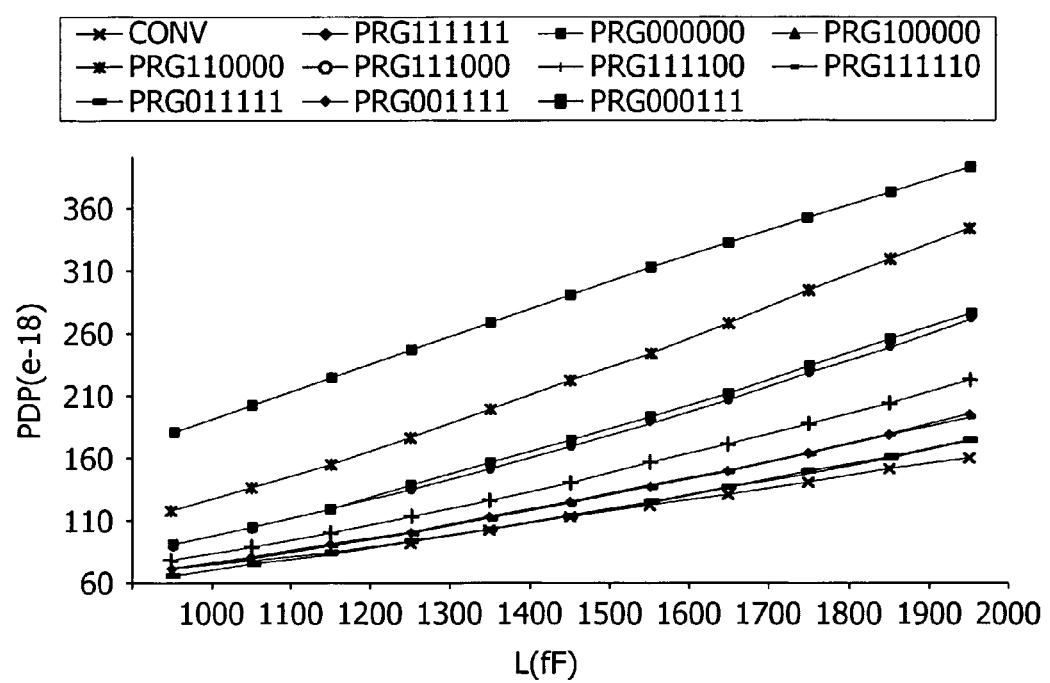

FIGS. 6 and 7 show plots of delay vs capacitive loads for the different buffer configurations, while FIGS. 8 and 9 show plots of power-delay-product (which is indicative of energy consumption) vs capacitive loads for the different buffer configurations in a 0.13 um CMOS technology. In the simulations, the capacitive load CL at the output of the programmable buffer 304 of FIG. 4 has been swept from 10 fF to 2 pF to mimic the variation of the load from the lowest load to the worst-case load.

From FIGS. 6 to 9, it can be gathered that the configuration "PRG110000" leads to the lowest energy consumption at an acceptable delay for loads in the range of 10 to 40 fF. Similarly, for other ranges of load, the programmable buffer can be tuned for having an acceptable delay and the least energy consumption. This is achieved by programming the control circuit 50 to control the programmable buffer in an appropriate manner so that the required number of stages is on, based on the configuration information obtained from the configuration memory 40.

According to another aspect of the present invention, the circuit components can be tailored to have just sufficient drive depending on the potential load by adjusting the threshold voltage of circuit elements.

Figure 10:
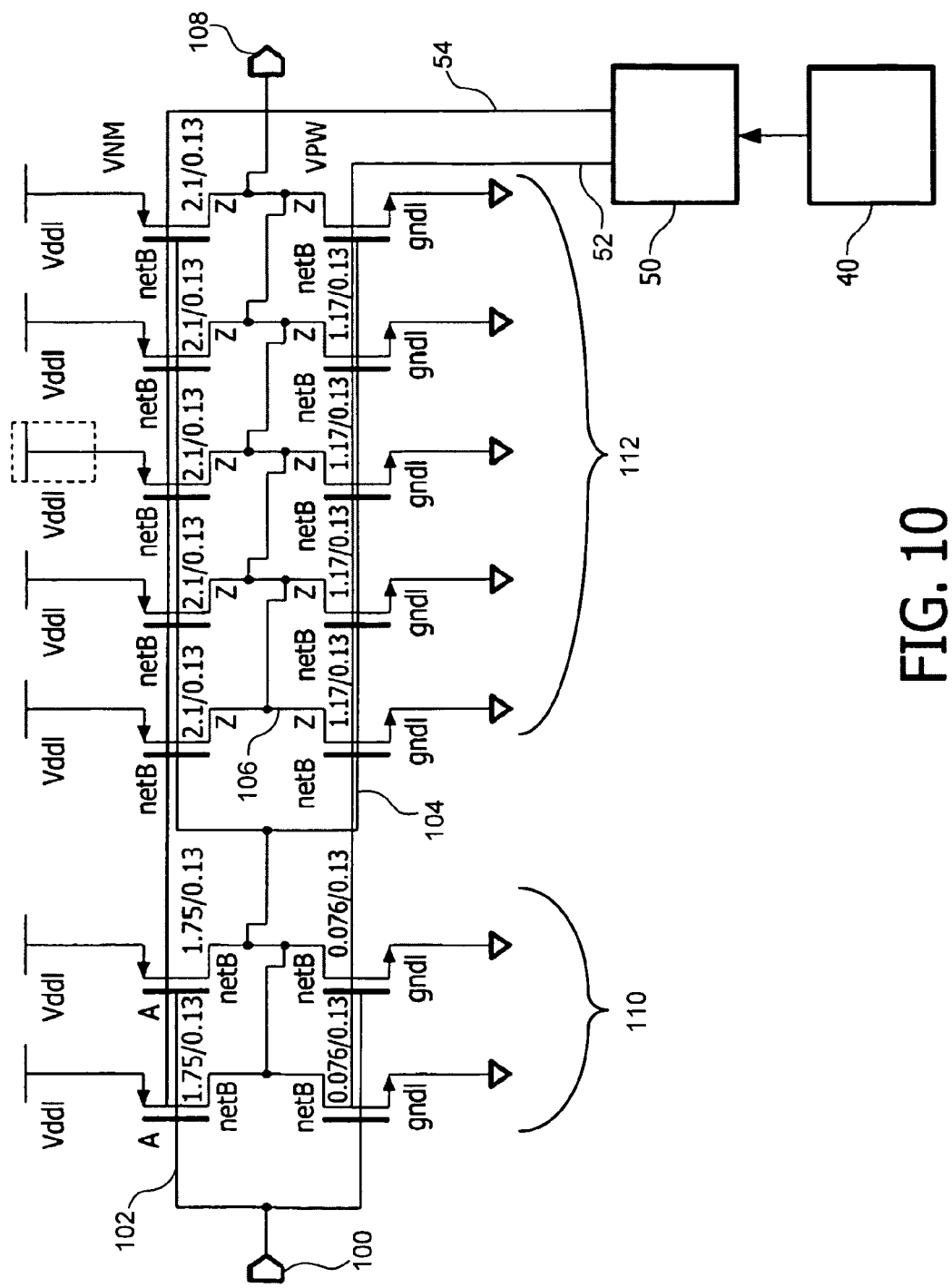
FIG. 10 shows a buffer circuit with varying threshold voltage according to a third preferred embodiment.
Figure 11:
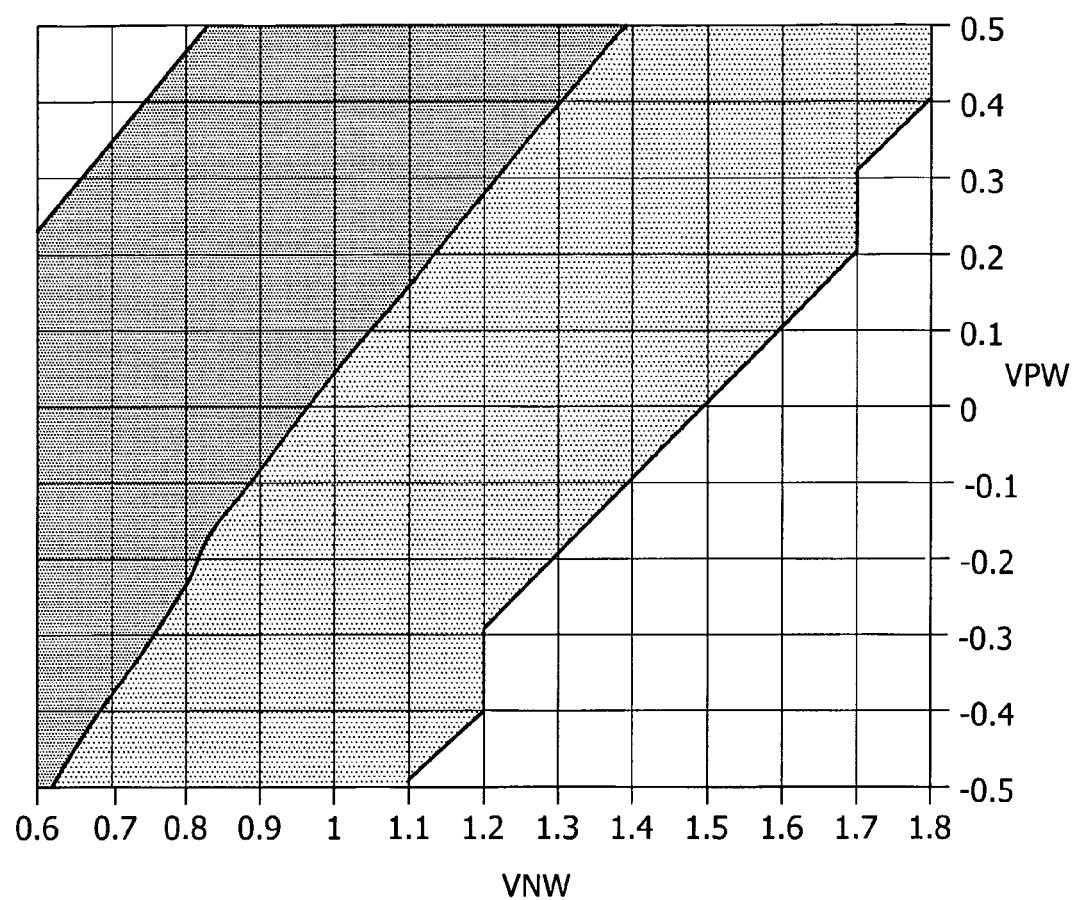
FIGS. 11 and 12 show diagrams of normalized delay for different bias voltages at different capacitive loads.

FIG. 10 shows a schematic circuit diagram of a multi-stage buffer circuit, wherein n-well and p-well bias voltages VNW and VPW can be controlled to change the threshold voltage of individual transistor elements or other semiconductor elements. The control of the bias voltages leads to the advantage that a smaller buffer circuit with lower power-delay-product (PDP) compared to conventional buffers can be achieved at identical or faster speed for all ranges of load from as small as 10 fF up to 2.75 pF. FIG. 10 includes a line 52, a line 54, an input 100, a line 102, a line 104, a line 106, an output 108, a first group of transistors 110, and a second group of transistors 112. Line 52 carries the p-well bias voltage VPW. Line 54 carries the n-well bias voltage VNW. Line 52 connects the control circuit 50 to the body of each transistor on the bottom rows of the transistors in the first and second group of transistors 110 and 112. Line 54 connects the control circuit 50 to the body of each transistor on the top rows of the transistors in the first and second group of transistors 110 and 112. Line 102 connects an input 100 to the gates of each of the transistors in the first group of transistors 110. Line 104 connects the drains of the first group of transistors 110 to the gates of each of the transistors in the second group of transistors 112. Line 106 connects the drains of the second group of transistors 112 to an output 108.

It will now be explained how optimization for lowest PDP can be achieved based on utilization of configuration awareness at the same or higher speed than conventional techniques.

According to FIG. 10, the control circuit 50 is used in this third embodiment to generate or supply the bias voltages VNW and VPW based on the configuration information supplied from the configuration memory 40.

Figure 12:
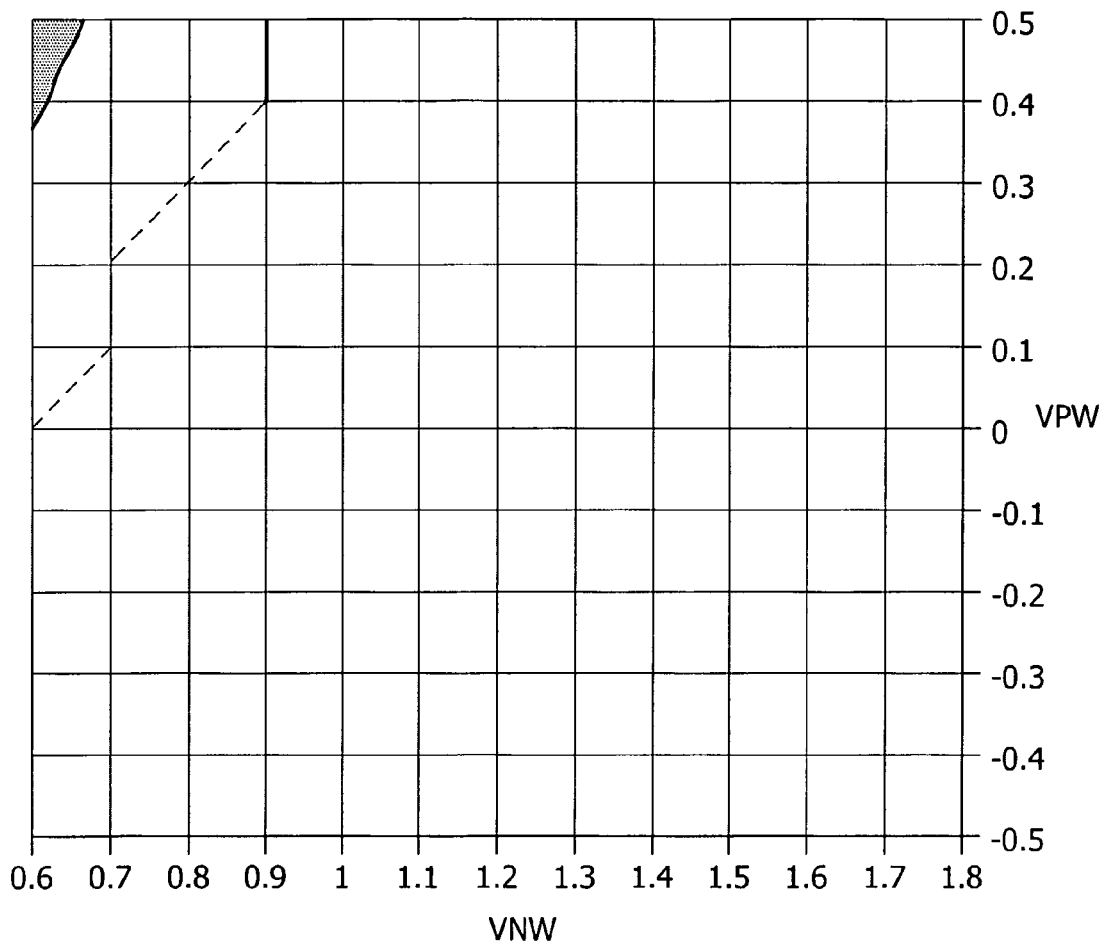
Figure 13:
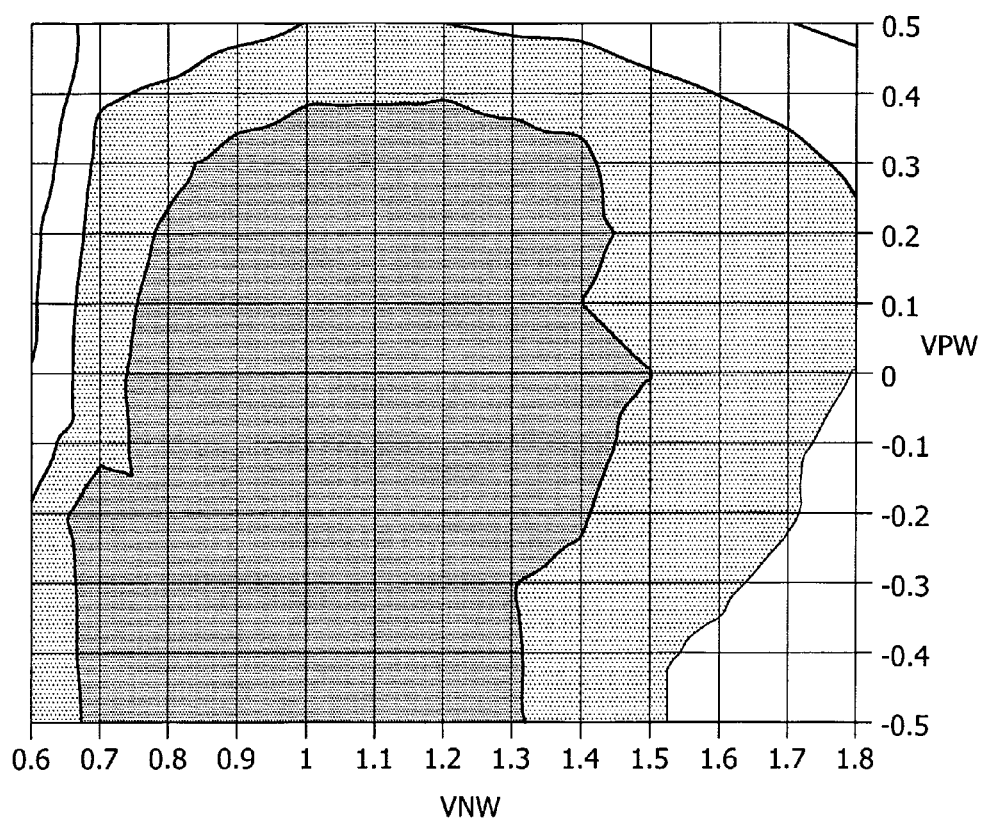
FIGS. 13 and 14 show diagrams of normalized power-delay-product for different bias voltages at different capacitive loads.
Figure 14:
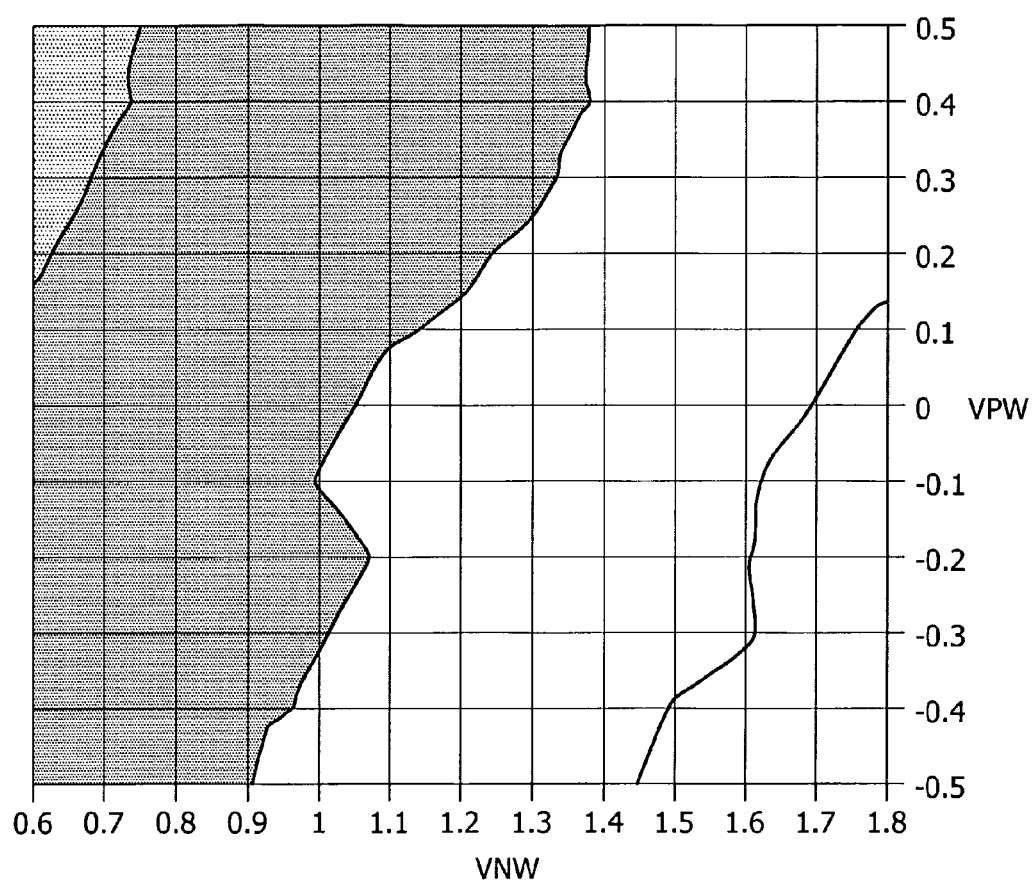

FIGS. 11 to 14 show diagrams indicating delay and PDP, respectively, of the bias-voltage-controlled buffer circuit of FIG. 10 normalized with respect to a conventional buffer circuit for a small capacitive load of 10 fF (FIG. 11 and FIG. 13) and for a worst-case capacitive load of 2.75 pF (FIGS. 12 and 14). When the load to be driven is actually as small as in the case of FIGS. 11 and 13, the conventional buffer would be oversized and would consume a lot of power.

If the proposed programmable or controllable buffer of FIG. 10 is used at normal bias voltages of VNW=1.2V and VPW=0V, a twenty percent reduction in PDP can be achieved, since the buffer is smaller, while maintaining the same speed. FIGS. 12 and 14 show the delay and PDP of the proposed buffer in FIG. 10 normalized with respect to the conventional buffer for the worst case capacitive load of 2.75 pF. In particular, the different areas in FIG. 11 indicate averages of normalized delays ranging from 0.7 to 0.8 in the left upper area, from 0.8 to 0.9 in the dark left area, and from 0.9 to 1 in the middle grey area. In FIG. 14, the average of the normalized delay ranges from 0.9 to 0.95 in the small dark area in the upper left portion, from 0.95 to 1 in the small white area in the upper left portion, and from 0.85 to 0.9 in the remaining area. In FIG. 13, the average of the normalized PDP ranges from 0.94 to 0.98 in the small white areas at the upper left corner and the upper and lower right corners, from 0.9 to 0.94 in the remaining white areas, from 0.86 to 0.9 in the grey area, and from 0.82 to 0.86 in the middle dark area. In FIG. 14, the average normalized PDP ranges from 0.8 to 0.99 in the grey area in the upper left portion, from 1.56 to 1.75 in the dark area, from 1.18 to 1.37 in the white area in the middle portion and from 1.37 to 1.56 in the white area in the lower right corner of the diagram.

It can be seen that providing a forward bias, the proposed buffer can be faster than the conventional buffer and can have a smaller PDP. For example, at bias voltages VNW=0.7V and VPW=0.5V, the proposed buffer is faster and has a lower power-delay-product (PDP).

The bias voltages can be generated on-chip by using the threshold drops of the PMOS and NMOS transistors. For high clock rates, this provides a stable reference, but for slow clock rates, a global on-chip reference generation circuitry which can be controlled by the control circuit 50 can be provided.

It is noted that the bias voltage not necessarily has to be generated by a reference voltage generator, but could as well be generated by a logic circuit which may be provided for example in the control circuit 50 of FIG. 10. Then, the logic circuit responds to a changing load of the buffer, which can be determined by observing the configuration memory 40 of the FPGA which controls the switches that the buffer drives, by changing the bias voltages VNW applied to the n-well and VPW applied to the p-well of the buffer circuit of FIG. 10.

The proposed tailoring of the circuit components for sufficient drive can be achieved either by varying the size of the buffers as proposed in the first and second embodiments or by adjusting the threshold voltage as proposed in the third embodiment or even by doing both in combination. Thereby, energy efficiency can be achieved by varying the drive strength based on the potential load that a component has to drive or which is supplied to a component.

It is to be noted that the proposed scheme not only reduces the energy consumption of FPGAs but also reduces off-state leakage and noise generation due to the lower time derivative (dI/dt) of the current. This lower time derivative means that the buffer can drain less current from the power supply per unit of time which results in a lower supply bounds and electromagnetic interference (EMI). Furthermore, the present invention is not restricted to the above embodiments but can applied for design of any circuit component where potential load at run-time can be determined. As an example, the proposed scheme can be applied in eFPGA circuits which are part of ASICs. In the proposed embodiments, the NMOS and PMOS transistors not necessarily need to be placed between another transistor and ground and another transistor and power supply, but can also be placed between the output node of a buffer or buffer stage and the bottom transistor, or between the output node and the top transistor. In general, the proposed scheme can be applied to the design of any load-sensitive bit configuration aware components for low energy circuit arrangements. Any circuit components, such as buffers, logic gates, connection boxes, switch boxes etc., which have different fan-in and fan-out load depending on the configuration, can be controlled by determining the expected load of the component and/or by dynamically sizing the drive power of the component that is sufficient to handle the load with acceptable delay. The embodiments may thus vary within the scope of the attached claims.

The invention claimed is:

1. A configurable circuit arrangement comprising at least one circuit component at which a load is applied that can vary during operation of said circuit arrangement, wherein said configurable circuit arrangement comprises:
   load determination means for determining a load applied at said at least one circuit component having different fan-in or fan-out depending on a configuration of said configurable circuit arrangement; and
   adjusting means for switching off a buffer connected to the at least one circuit component according to the determination of the applied load, wherein switching off the buffer adjusts a drive capacity of said at least one circuit component to a value less than a maximum drive capacity while still meeting a delay specification.

2. A configurable circuit arrangement according to claim 1, wherein said determination means is configured to determine said load based on a configuration information loaded to said configurable circuit arrangement.

3. A configurable circuit arrangement according to claim 2, wherein said configuration information comprises a configuration bit stream defining at least one of an input load and an output load of said at least one circuit component.

4. A configurable circuit arrangement according to claim 1, wherein said adjusting means is adapted to generate at least one control signal for simultaneously switching off a section of buffers.

5. A configurable circuit arrangement according to claim 4, wherein said adjusting means is adapted to derive said control signal from a most significant bit signal of a selection signal obtained from said determination means.

6. A configurable circuit arrangement according to claim 1, wherein said adjusting means is configured to vary a threshold voltage of circuit elements of said configurable circuit arrangement.

7. A configurable circuit arrangement according to claim 6, wherein said adjusting means is adapted to change at least one bias voltage responsive to said determination means.

8. A configurable circuit arrangement according to claim 1, wherein said configurable circuit arrangement is a field programmable gate array device.

9. A configurable circuit arrangement comprising:
   at least one circuit component at which a load is applied that can vary during operation of said configurable circuit arrangement;
   load determination means for determining a load applied at said at least one circuit component, wherein the at least one circuit component has different fan-in or fan-out depending on a configuration of said configurable circuit arrangement, wherein said determination means is configured to determine said load based on a configuration information loaded to said configurable circuit arrangement, wherein said configuration information is stored in a configuration memory; and
   adjusting means for switching off a buffer connected to the at least one circuit component according to the determination of the applied load, wherein switching off the buffer adjusts a drive capacity of said at least one circuit component to a value less than a maximum drive capacity while still meeting a delay specification.

10. A configurable circuit arrangement according to claim 9, wherein said configuration information comprises a configuration bit stream defining at least one of an input load and an output load of said at least one circuit component.

11. A configurable circuit arrangement according to claim 9, wherein said adjusting means is adapted to generate at least one control signal for simultaneously switching off a section of buffers.

12. A configurable circuit arrangement according to claim 11, wherein said adjusting means is adapted to derive said control signal from a most significant bit signal of a selection signal obtained from said determination means.

13. A configurable circuit arrangement according to claim 9, wherein said adjusting means is configured to vary a threshold voltage of circuit elements of said configurable circuit arrangement.

14. A configurable circuit arrangement according to claim 13, wherein said adjusting means is adapted to change at least one bias voltage responsive to said determination means.

15. A configurable circuit arrangement according to claim 9, wherein said configurable circuit arrangement comprises a field programmable gate array device.

* * * * *